United States Patent
Sekine et al.

[11] Patent Number: 5,861,233
[45] Date of Patent: Jan. 19, 1999

[54] PATTERN FORMING METHOD BY IMPARTING HYDROGEN ATOMS AND SELECTIVELY DEPOSITING METAL FILM

[75] Inventors: Yasuhiro Sekine, Yokohama; Genzo Momma, Hiratsuka; Hiroshi Yuzurihara, Isehara, all of Japan

[73] Assignee: Canon Kabushiki Kaisha, Tokyo, Japan

[21] Appl. No.: 662,200

[22] Filed: Jun. 11, 1996

Related U.S. Application Data

[63] Continuation of Ser. No. 103,035, Jul. 28, 1993, abandoned.

[30] Foreign Application Priority Data

Jul. 31, 1992 [JP] Japan ..................... 4-204938

[51] Int. Cl.$^6$ .............. G03C 5/00; B44C 1/22; B05D 3/06
[52] U.S. Cl. .................. 430/296; 430/323; 430/324; 438/700; 216/41; 216/51; 427/552
[58] Field of Search ............... 430/5, 269, 296, 430/324, 323; 428/250, 526, 552, 555, 558; 156/659.11; 427/250, 526, 552, 555, 558; 216/12, 41, 51; 438/700, 948

[56] References Cited

U.S. PATENT DOCUMENTS

| | | | |
|---|---|---|---|
| 3,776,770 | 12/1973 | Lando | 438/514 |
| 4,377,627 | 3/1983 | Vinton | 430/22 |
| 4,983,537 | 1/1991 | Wei | 438/425 |
| 5,051,326 | 9/1991 | Celler et al. | 430/5 |
| 5,096,791 | 3/1992 | Yahalom | 430/5 |
| 5,151,305 | 9/1992 | Matsumoto et al. | 427/252 |
| 5,179,042 | 1/1993 | Mikoshiba et al. | 438/603 |
| 5,233,224 | 8/1993 | Ikeda et al. | 257/773 |
| 5,580,615 | 12/1996 | Itoh et al. | 427/552 |

FOREIGN PATENT DOCUMENTS

| | | | |
|---|---|---|---|
| 0425084 | 5/1991 | European Pat. Off. | C23C 16/20 |
| 0466320 | 1/1992 | European Pat. Off. | H01L 21/285 |
| 3183768 | 8/1991 | Japan | C23C 16/20 |

OTHER PUBLICATIONS

Howe. A.T. et al., "Patterned tungsten chemical vapor deposition on amorphous silicon by excimer laser modification of the native oxide", Applied Physics Letters, Jun. 4, 1990, vol. 56, pp. 2322–2324.

Bouree J.E. et al., Al photodeposition and light–induced nucleation on p–type Si from TMA, Laser– and Particle––Beam Chemical Processes on Surfaces Symposium, Materials Research Society, vol. 129, pp. 251–258.

37th National Symposium of the American Vacuum Society, Oct. 8–10, 1990, vol. 9, No. 3, Journal of Vacuum Science & Technology A (Vaccum, Surfaces and Films), May–Jun., 1991, pp. 1045–1050, Mantell D.A., "Surface mechanisms in aluminum chemical vapor deposition".

Japanese Abstract, Derwent Publications Ltd., Class E19, AN 87–031813 & JP–A–61 286 847, Dec. 17, 1986.

*Primary Examiner*—Bernard P. Codd
*Attorney, Agent, or Firm*—Fitzpatrick, Cella, Harper & Scinto

[57] ABSTRACT

A pattern forming method comprises subjecting a surface of a semiconductor substrate to a surface treatment for imparting hydrogen atoms, irradiating a desired region of said surface with an energy ray, selectively forming a metal film on a non-irradiated region other than the desired region, and etching said semiconductor substrate using said metal film as a mask.

3 Claims, 8 Drawing Sheets

PATTERN FORMING METHOD BY IMPARTING HYDROGEN ATOMS AND SELECTIVELY DEPOSITING METAL FILM

This application is a continuation of application Ser. No. 08/103,035 filed Jul. 28, 1993, now abandoned.

BACKGROUND OF THE INVENTION

1. Field of the Invention

This invention relates to a pattern forming method used in fabricating semiconductor devices. More particularly, it relates to a method of forming a pattern serving as an etching mask, and a method of preparing a photomask for photolithography.

2. Related Background Art

Organic resists have been conventionally used when fine processing is carried out. Using the organic resists as masks, desired patterns are formed by dry etching or the like. Here, in the formation of organic resist fine patterns serving as masks, the processing dimension of organic resists would be limited to of 0.15 μm at best even with an improvement in photomasks used, an improvement in energy ray irradiation apparatus and an improvement in the organic resists.

When the organic resists are developed, the processing size would slightly deviate from the desired size. Accordingly, in photolithography hitherto widely used in VLSI processes, it has been very difficult to control the processing dimension of the organic resists in a good precision of as fine as 0.1 μm or less.

Meanwhile, in photolithographic techniques, photomasks previously provided with patterns of diffusion regions, separating regions, wiring, contact holes, etc. to be formed on a wafer are used and these patterns are successively optically transferred to wafers while keeping their mutual overlap precision. As a system for transferring the patterns on the masks to a wafer, a reduction projection exposure system called a stepper is prevalent at present. In the stepper, patterns on reticles (masks for the stepper are particularly called reticles) are reduced to ⅕ and transferred onto a wafer. At present, it has become possible to transfer a pattern with a width of 0.5 to 0.8 μm onto a wafer at a positional precision of 0.2 μm or less. At this time, the standards of dimensional precision, positional precision, etc. required for light-screening film patterns on the reticle are considered to be values obtained by subtracting errors occurring when patterns are transferred onto a wafer, from the precision actually acceptable on a wafer.

Now, a dimensional error tolerable in a reticle dimension will be estimated, which is intended for an example in which a pattern with a width of 0.5 μm is formed on a wafer at a dimensional precision of ±10%. Assume that there are three kinds of dimensional variation factors in a process of forming the pattern onto a wafer, i.e., i) errors in reticle dimension, ii) a resist pattern formation step and iii) an etching step, and their contributions are ⅓ each, the dimensional variation error tolerable as a reticle dimensional error comes to be ±0.08 μm around 2.5 μm.

In the meantime, as a method of forming light-screening film patterns on the reticle, electron beam (hereinafter "EB") photolithography is prevalent, this is a process making use of an EB exposure apparatus as an exposure system. Its formation process and main factors of dimensional variations of the light-screening film pattern in each step are shown below.

1. Polishing and washing a light-transmissive substrate (surface flatness, scratches).
2. Depositing a light-screening film on the light-transmissive substrate (layer thickness, adhesion).
3. Coating an EB resist on the light-screening film (layer thickness, sensitivity).
4. Exposure using the EB exposure apparatus (beam precision, amount of exposure).
5. Development of the EB resist exposed (rate of development).
6. Etching of the light-screening film by using the EB resist pattern as an etching mask (difference in pattern conversion).

As shown above, in the conventional EB photolithography, a pattern of highly precise electron beams irradiated from an EB exposure apparatus is first shed on an EB resist to cause a chemical change in the EB resist, and then development is carried out to convert it into an EB resist pattern. Next, using as an etching mask the EB resist pattern thus formed, the light-screening film is etched to form a light-screening film pattern. Hence, it follows that the dimensional variations of the light-screening film pattern finally formed include, in addition to the precision of the pattern of electron beams irradiated from an EB exposure apparatus, an error occurring when the pattern of electron beams is converted into the EB resist pattern, and a difference in pattern conversion produced when the light-screening film is etched using the EB resist pattern as an etching mask.

Since, however, the pattern-generating precision of the EB exposure apparatus is about ±0.1 μm at present, it is necessary to keep the pattern-generating precision of the EB exposure apparatus and also make virtually zero the error factors that affect other dimensions and positional precision, in order to achieve the tolerable error ±0.08 calculated above. This fact shows that reticles necessary to form pattern dimension of 0.5 μm or less on a wafer can be prepared with great difficulty when a conventional reticle preparation process is used. Hence, in order to establish the formation of fine patterns in a dimension of 0.5 μm or less as a mass production technique in future, it is prerequisite to establish the technique for preparing high-precision reticles.

As the photomasks, those provided with a light-screening film pattern comprising chromium or the like, formed on a transparent substrate, have been hitherto used. However, as LSIs are made to have higher integration and patterns formed on wafers are made finer, it has been attempted to change the construction of photomasks so that the result of transferred pattern can be more improved, and there is a proposal of a technique called a phase-shift mask.

The phase-shift mask is a mask on the surface of which a pattern comprising what is called a phase shifter is formed in addition to a pattern comprising conventional light-screening film regions and light-transmitting regions. The phase shifter has a function to cause changes in the phases of transmitted light, where the positional relationship between the phase of this phase shifter and the light-screening film pattern and light-transmitting regions may be appropriately designed to form a mask. This makes it possible to obtain phase-shift masks with a higher resolution limit than conventional masks even when a projection lens of the same kind is used.

Thus, in the phase-shift mask, different from conventional photomasks, a light-screening film pattern and a phase shifter pattern must be formed on the photomask substrate. In addition, in order to obtain highly precise transfer patterns, both the light-screening film pattern and the phase shifter pattern must be formed faithfully to the designed size. Moreover, the overlap of the light-screening film pattern and the phase shifter pattern must be precise, and hence its preparation process becomes more complicated than that for conventional photomasks and various technical breakthroughs are needed.

The technical breakthroughs leading to a solution include, for one thing, a method of forming a phase shifter pattern. In a conventional photomask preparation process, the electron beam lithography is used to draw a pattern on an electron beam resist film by means of an electron beam exposure apparatus, followed by development to form a resist pattern, and a light-screening film is etched using this resist pattern as an etching mask of light-screening film. A light-screening film pattern is thus formed.

Hence, it is also possible to similarly use the conventional electron beam lithography in the formation of phase shifter patterns. However, an actual attempt to form phase shifter patterns according to the conventional process has revealed that there are the following two main problems.

One of them is the deterioration of mask surfaces that occurs when phase shifter patterns are formed by etching, and the other is a poor dimensional precision of phase shifter patterns that results when phase shifter patterns are formed by etching using an electron beam resist pattern as an etching mask.

It is difficult to avoid these two problems so long as dry etching such as reactive ion etching, capable of achieving anisotropic etching, is used as an etching process. Accordingly, it has been sought to establish a method by which phase shifter patterns can be formed without causing the deterioration of mask surfaces and also with high precision.

SUMMARY OF THE INVENTION

A first object of the present invention is to provide a pattern forming method that can solve the technical problems involved in the prior art and can form a fine pattern, e.g., a pattern formed in a width of 0.1 $\mu$m or less.

According to the present invention, a semiconductor substrate or a thin film formed on the semiconductor substrate is subjected to surface treatment to impart hydrogen atoms to its surface, thereafter the surface is selectively irradiated with an energy ray to form an irradiated region, irradiated with the energy ray, and a non-irradiated region on the surface of said substrate or thin film, and an Al thin film is selectively formed on the non-irradiated region, followed by dry etching using the Al thin film as a mask.

A second object of the present invention is to provide a novel, a pattern forming method capable of forming a light-screening film pattern having a pattern form very faithful to a pattern defined as a region in which the surface of a reticle is irradiated with an energy ray.

A third object of the present invention is to provide a pattern forming method comprising subjecting a semiconductor substrate to surface treatment to impart hydrogen atoms to its surface, irradiating said surface with an energy ray in the desired region thereof, selectively forming a metal film on a non-irradiated region which is a region other than the irradiated region, and etching said semiconductor substrate using said metal film as a mask.

A fourth object of the present invention is to provide a pattern forming method comprising forming a semiconductor film on a substrate having an insulating surface, subjecting said semiconductor film to surface treatment to impart hydrogen atoms to its surface, irradiating said surface with an energy ray in the desired region thereof, selectively forming a metal film on a non-irradiated region which is a region other than the irradiated region, and etching the surface of said semiconductor substrate using said metal film as a mask.

A fifth object of the present invention is to provide a pattern forming method comprising forming a light-screening thin film on a light-transmissive substrate, subjecting said thin film to surface treatment to impart hydrogen atoms to its surface, irradiating said surface with an energy ray in the desired region thereof, selectively forming a metal film on a non-irradiated region which is a region other than the irradiated region, and etching said thin film using said metal film as a mask.

A sixth object of the present invention is to provide a method of preparing a photomask, comprising subjecting a substrate to surface treatment to impart hydrogen atoms to its surface, selectively irradiating said surface with an energy ray in the desired region thereof, selectively forming a thin film on a non-irradiated region which is a region other than the irradiated region, and causing said thin film to undergo a chemical change to convert it into a light-transmissive thin film.

DESCRIPTION OF THE PREFERRED EMBODIMENTS

Figure 1A:
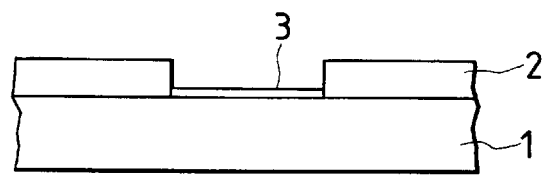
FIGS. 1A to 1F diagrammatically illustrate a pattern forming method according to a first example of the present invention.

The light-transmissive substrate used in the present invention is made of a material such as quartz glass and a low-expansion glass, having a high transmission to ultraviolet rays and capable of ensuring a good adhesion to the light-screening thin film, which is formed into a plate and is used after its surface has been made smooth by polishing and it has been ascertained that any optically observable foreign matters such as bubbles and striae are absent or not more than the standard in its inside.

As the light-screening thin film, a silicon film is preferably used. The silicon film may be formed by sputtering, CVD or vacuum deposition, any of which can be used to obtain good results. The light-screening thin film may be formed in a multilayer structure. As an example thereof, it may have a structure consisting of a first layer formed of a MoSi$_2$ film and a second layer formed of a sputtering silicon film. As another example thereof, it may be consisting of a first layer formed of a Cr layer, a second layer formed of an organic resist layer which is obtained by thoroughly subjecting to heat-resistant treatment and degassing treatment by UV irradiation and high-temperature baking, and a third layer formed of an amorphous silicon film by plasma CVD.

Surface modification to impart hydrogen atoms to the surface of the light-screening thin film may be carried out by cleaning the surface of the light-screening thin film with an aqueous hydrofluoric acid solution to remove a naturally oxidized film on the outermost surface layer, followed by rinsing in an ultra-pure water. This method is most simple and surest.

Irradiation with energy rays may be carried out using an EB exposure apparatus, a laser beam exposure apparatus, an ion beam apparatus, an ultraviolet exposure apparatus or the like, which apparatus itself is capable of generating a pattern formed of energy rays and forming an energy ray irradiated region and a non-irradiated region on the outermost surface layer of the light-screening thin film. Using any of these apparatus, energy beams are shed therefrom in the direction perpendicular or oblique to the surface. In particular, the EB exposure apparatus is effective for the formation of very fine energy ray irradiated region and non-irradiated region since the diameter of an electron beam used in the irradiation with energy rays can be reduced to the order of nanometers.

The metal thin film can be selectively formed on the non-irradiated region by a process including chemical vapor deposition making use of a mixed gas of alkylaluminum hydride and hydrogen as a reaction gas. Use of this process enables selective formation of an Al film on the region non-irradiated with energy rays on the surface of the light-screening thin film. The selective formation of the Al film is a phenomenon that occurs according to whether or not the surface of the light-screening thin film is terminated with hydrogen atoms. More specifically, only the hydrogen atoms at the region irradiated with energy rays are eliminated upon selective irradiation with energy rays on the surface of the light-screening thin film the whole surface of which has been hydrogen-terminated by the surface treatment described above, and thereafter the chemical vapor deposition is carried out whereby the Al film can be selectively formed only on the hydrogen-terminated region. The presence or absence of hydrogen atoms on the surface of the light-screening thin film enables selection of deposition or non-deposition, and hence a very fine Al film pattern can be formed at an atomic level. Starting material gases may include alkylaluminum hydrides, among which, in particular, dimethylaluminum hydride may be used. Its use enables deposition of Al films with good selectivity. The above selective Al film deposition according to the presence or absence of hydrogen termination is detailed in Japanese Patent Application Laid-open No. 3-183768.

The light-screening thin film can be etched by the use of anisotropic etching. In the anisotropic etching, the rate of etching in the direction perpendicular to the material to be etched is high and the rate of etching in the direction parallel thereto is low. Hence the pattern edges formed by etching become nearly vertical and it is possible to obtain an etching pattern faithfully reflecting the shape of an etching mask.

In the present invention, an Al pattern is used as the etching mask. In comparison of properties as etching masks, the Al mask has a great advantage in that its etching resistance to the anisotropic etching is higher than that of the EB resist masks conventionally used.

As the anisotropic etching, reactive ion etching or reactive ion beam etching is usually used in many instances. Both of these methods mainly make use of ions as etching active species, and the reactive ions thereof are made incident perpendicularly to the material to be etched, to effect anisotropic etching by virtue of the sputtering attributable to ions and the chemical reaction of ions with the material to be etched. On that occasion, it is known that not only the material to be etched but also the etching mask are simultaneously etched on the surface being etched. At this time, at the substrate surface the temperature has risen because of influence by the incidence of ions and the heat of reaction. The rate of etching increases to bring about a decrease in the dimension of the etching mask in the case of the etching mask comprising an EB resist. As a result, the shape of an etching pattern becomes different from the shape of the EB resist mask. On the other hand, in the case of the Al mask, its etching resistance is high enough under usual etching conditions and its sputtering rate is smaller than that of other substances, so long as a chlorine type reactive gas that may directly etch Al is not used. Hence, the etching reaction may also bring about only a very small dimensional variation in the etching mask, so that the shape of an etching pattern can faithfully reflect the shape of the etching mask Al pattern. In particular, when, in the etching of Si materials, Al is used as the etching mask in reactive ion beam etching carried out under a low gas pressure using a reaction gas of a fluorocarbon type, the Al surface reacts with the active species of the fluorocarbon gas, and is covered with an inert thin film comprising AlF$_3$ or the like, which protects the inside, so that an etching process with a very high precision can be achieved.

As described above, the present invention makes it possible to obtain a highly precise reticle forming a light-screening pattern that can be free from the dimensional error produced when the pattern of electron beams is converted into the EB resist pattern and the dimensional error produced when the light-screening film is etched using the EB resist pattern as a mask, which have not been advantageous in the EB lithography in conventional reticle preparation processes, and can be faithful to the pattern drawn in the step of electron beam exposure.

EXAMPLE 1

A first example of the present invention will be described below.

The first example shows an example in which the present invention is applied to a mask for etching Si substrates.

First, as shown in FIG. 1A, a substrate 1 comprising a p-type (100) Si substrate of 10–20Ω·cm was oxidized in an oven to form an oxide layer 2 on the Si substrate. The oxide layer was in a thickness of 3,000 to 7,000 Å. The oxide layer was subjected to photolithography to make openings at its desired portions. In each of the openings, a thin oxide 3 layer was formed in a thickness of about 200 to 300 Å (Step a.). Next, as n-type impurities, As was implanted by ion implantation using as a mask the thick oxide layer 2 remaining on the Si substrate. At this time, the ion implantation was carried out under conditions of a dose of IE1×10$^{14}$ to 1×10$^{15}$/cm$^2$ and an accelerating voltage of 50 keV to 70 keV. The As thus implanted was then caused to diffuse, in an oven. Reference numeral 4 is a region where As is diffused into the substrate.

Figure 1B:
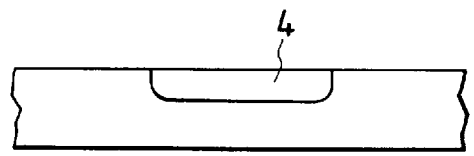

Next, as shown in FIG. 1B, the oxide layer present on the Si substrate was removed using a HF solution (Step b.).

Figure 1C:
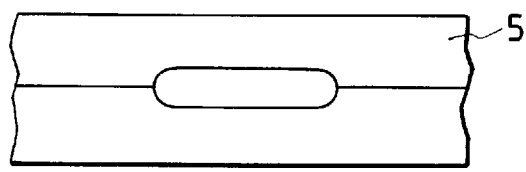

Next, as shown in FIG. 1C, on the p-type substrate, an n-type epitaxial layer 5 was formed by epitaxial growth in a thickness of 2 μm (Step c.).

Next, in order to hydrogen-terminate the surface (Si surface) of the epitaxial layer, a chemical treatment was applied in the following procedure.

(1) Cleaning with $H_2SO_4:H_2O_2=1:4$.
(2) Rinsing with pure water.
(3) Immersing (for 1 minute) in $HF:H_2O=1:100$.
(4) Rinsing with pure water.

Figure 1D:
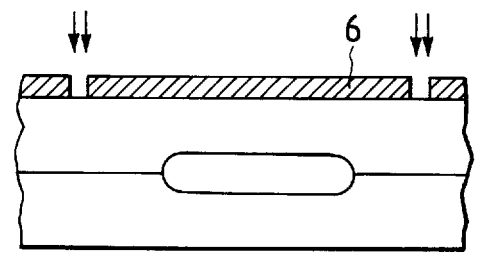

Next, only the portions at which the Si substrate was to be etched was irradiated with electron rays. The accelerating voltage of electron beams was set at 25 kV. The electron beams were at an irradiation dose of $5\times10^{17}$ electrons/cm$^2$. After the irradiation with electron rays, an Al film 6 was deposited by chemical vapor deposition. Here, the CVD as disclosed in Japanese Patent Application Laid-open No. 3-183768 was employed, in which dimethylaluminum hydride and hydrogen were used. As a result of the deposition of Al, a pattern 6 with a pattern space width of 0.1 µm and an Al layer thickness of 0.5 µm was formed, as shown in FIG. 1D (Step d.).

Figure 1E:
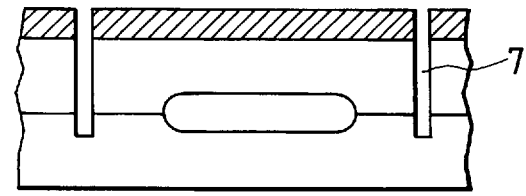

Thereafter, Electron Cyclotron Resonance (ECR) plasma etching was carried out to etch away the portions not masked with Al, i.e., the portions at which the Si surface was uncovered. In the etching, $CBrF_3$ and $CCl_2F_2$ gases were used. The etching was carried out under conditions as follows: Gas flow rate: 20 to 60 sccm; pressure: 1 to $10\times10^{-2}$ Pa; magnetron current: 200 to 400 mA; and substrate bias: 0 to 150 W. As a result of the above etching, as shown in FIG. 1E, a trench (groove) 7 was formed in an etching depth of 3 µm and a pattern space width of 0.1 µm. Even after the etching of the Si substrate, there was no change in the shape of the mask Al material (Step e.).

Figure 1F:
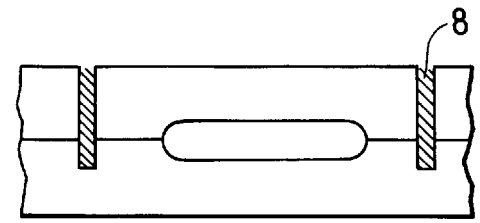

Next, in order to remove the Al film serving as a mask, the Al film used as the mask was removed using an Al-etching solution of a phosphoric acid-nitric acid type. With regard to Al residues questioned here, measurement by ESCA was made to ascertain that it was not more than $10^{12}$ atoms/cm$^2$ having an influence on devices. Next, in order to clean the inside of the trench 7, an $HCl-H_2O_2$ solution and pure water were sprayed on the Si substrate by means of a jet nozzle. The inside of the trench was thus cleaned. Then, an $SiO_2$ film 8 was formed inside the trench by vacuum oven oxidation so that $SiO_2$ was buried therein as shown in FIG. 1F (Step f.). With regard to this burying, it was also possible to bury an oxide film inside the trench by the use of spin-on-glass. At this time, in-oven baking was carried out at 900° to 1,000° C. in order to strengthen the Si—O bonds inside the trench.

The above process made it possible to form a trench isolation region with an isolation width of 0.1 µm and a trench depth of 3 µm.

EXAMPLE 2

This example shows an instance in which the present invention is applied when contact holes are formed.

Figure 2A:
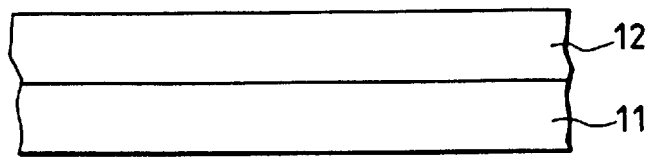
FIGS. 2A to 2E diagrammatically illustrate a pattern forming method according to a second example of the present invention.
Figure 2B:
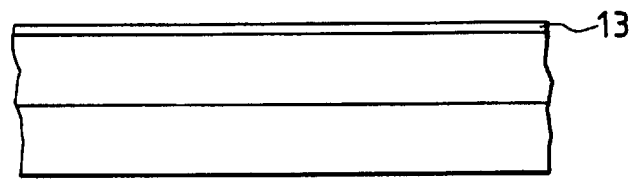

As shown in FIG. 2A, on a substrate 11 having a Si substrate and an epitaxial layer, BPSG (boron phosphosilicate glass) 12 was deposited in a thickness of 3,000 to 5,000 Å. Here, complementary MOS of bipolar structure (not shown) was formed on the surface of the substrate 11. Next, this substrate was heated at 800° to 1,000° C. to cause the BPSG 12 to reflow (Step a.). Then, as shown in FIG. 2B, on the BPSG 12, a Poly-Si (polycrystalline silicon) film 13 was formed by LPCVD (low-pressure chemical vapor deposition) in a thickness of 50 to 100 Å. At this time, the Poly-Si film deposition by LPCVD was carried out under conditions of a temperature of 500° to 600° C. and a pressure of 10 to 50 Pa using $SiH_4$ and $N_2$ as gas species, and at a deposition rate of 50 Å/min (Step b.).

Next, a chemical treatment was applied in order to hydrogen-terminate the surface of the Poly-Si film. This treatment was the same as that in Example 1.

Figure 2C:
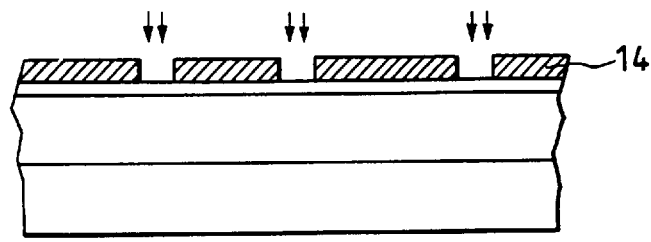

Next, only the portions corresponding to contact holes were irradiated with electron rays. Here, this irradiation and the subsequent deposition of an Al film were carried out in the same manner as in Example 1 (Step c.). As a result of the deposition of the Al film, an Al mask 14 with an Al layer thickness of 0.1 µm and an opening of 0.1 µm for contact hole was formed as shown in FIG. 2C.

Figure 2D:
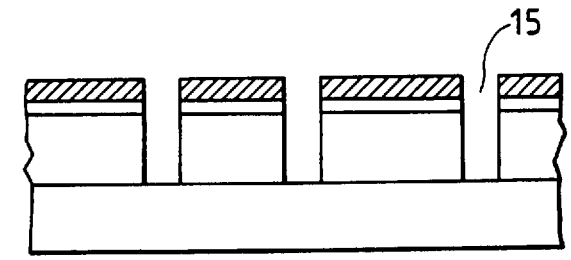

Using the Al film as a mask, BPSG was etched using an ECR type microwave plasma etching apparatus as shown in FIG. 2D (Step d.). The etching was carried out in two steps, where the upper layer Poly-Si film was etched in the first step, and the BPSG was etched in the second step. The first and second steps were performed under conditions as shown in Table 1 below. The inside of the contact holes 15 were cleaned in a final step as described below.

TABLE 1

|  | Gas species | Flow rate (sccm) | Pressure (Pa) | Power (mA) | Substrate bias (V) |
| --- | --- | --- | --- | --- | --- |
| First step: | $NF_3$ | 20–60 | $1-10 \times 10^{-2}$ | 200–400 | 0–100 |
| Second step: | $CHF_3$ | 20–60 | $1-10 \times 10^{-2}$ | 200–400 | 25–200 |

Figure 2E:
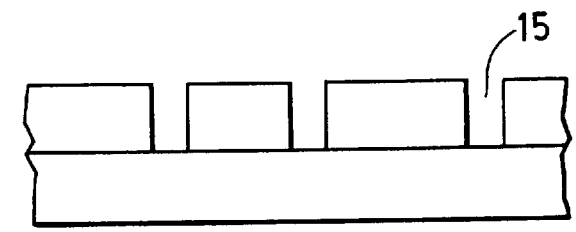

Next, the Al film and Poly-Si film used as masks were removed by wet etching. The Al film was removed using an $HCl-H_2O_2$ solution, and the Poly-Si film, using an aqueous ethylenediamine-pyrocatechol solution as shown in FIG. 2E (Step e.). Next, in order to clean the substrate surface, an $HCl-H_2O_2$ solution was sprayed on the Si substrate by means of a jet nozzle. The insides of the contact holes 15 were thus cleaned.

The above process made it possible to form contact holes with an opening of 0.1 µm.

EXAMPLE 3

This example shows an instance in which the present invention was applied to form a gate electrode of MOS transistors.

Figure 3A:
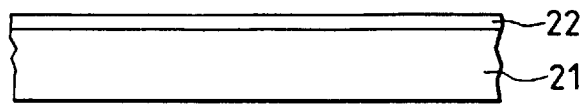
FIGS. 3A to 3E diagrammatically illustrate a pattern forming method according to a third example of the present invention.
Figure 3B:
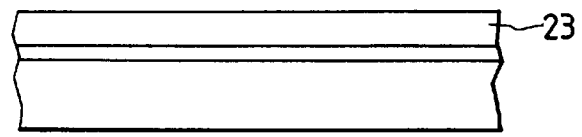
Figure 3C:
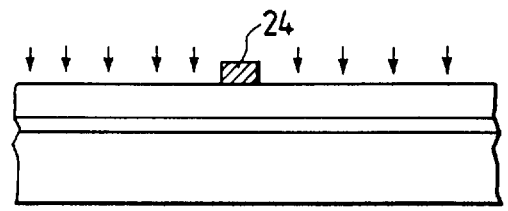

As shown in FIG. 3A, a gate oxide film 22 with a thickness of 30 to 100 Å was formed on a Si substrate 21 (Step a.), and a Poly-Si film 23 was formed on the gate oxide film by CVD (chemical vapor deposition). The Poly-Si film was in a layer thickness of 1,500 to 2,500 Å. Subsequently, from the upper part of the Poly-Si film, phosphorus ion was implanted, followed by annealing to from an n-type doped Poly-Si film as shown in FIG. 3B (Step b.). At this time, the ion implantation was carried out under conditions of a dose of $5\times10^{15}$ to $10\times10^{15}$ and an accelerating voltage of 60 to 80 keV. The annealing was carried out in an atmosphere of $N_2$ at 900° to 950° C. for 20 to 40 min. Next, in order to hydrogen-terminate the surface, a chemical treatment was applied. The treatment was made under the same conditions as in Example 1. Then, the region other than that necessary for the formation of a gate electrode was irradiated with electron rays, under conditions entirely the same as in Example 1. Next, as shown in FIG. 3C, an Al film 24 was deposited on the Poly-Si film 23 by chemical gaseous phase growth. The deposition of the Al film was carried out by the same means as in Example 1 (Step c.).

Figure 3D:
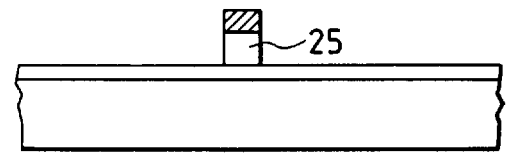

As a result of the above deposition of the Al film, it was possible to form an Al pattern having an Al line width of 0.1

μm and an Al layer thickness of 0.5 μm on the Poly-Si film 23. Next, using the Al pattern as a mask, the Poly-Si film was etched by Electron Cyclotron Resonance (ECR) microwave plasma etching as shown in FIG. 3D. The etching was carried out using an HBr—SF$_2$ mixed gas under conditions of a gas flow rate of 10 to 60 sccm each, a pressure of 1 to $10 \times 10^{-2}$ Pa, a microwave power of 100 to 350 mA and a substrate bias of 50 to 150 V (Step d.).

Figure 3E:
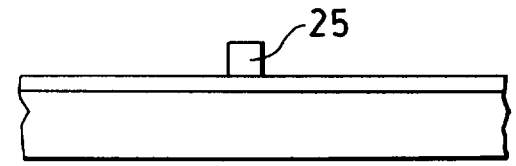

Next, as shown in FIG. 3E, the Al film used as a mask was removed by wet etching. An HCl—H$_2$O$_2$ solution was used as an etching solution. Then, an HCl—H$_2$O$_2$ solution was sprayed on the substrate surface by means of a jet nozzle to clean a gate (shown in FIG. 3D) exposing to the surface of the Si substrate and to clean the gate oxide film 22 (Step e.).

The above process made it possible to form a gate electrode 25 with a line width of 0.1 μm. At the same time with the formation of the electrode, it was also possible to form doped Poly-Si wiring. Using the pattern forming method of Example 2, it also became possible to form ultrafine gate patterns on W, Mo, Ti, Ta or a silicide of any of these and a polyside having a multi-layer structure (silicide/Poly-Si), which were usable as gate materials. Using a conductive resist, carrying out irradiation with electron rays, depositing an Al film and using the Al film as a mask for the conductive resist, it still also became possible to draw a pattern on the conductive resist and use the resulting conductive resist as a film to be etched or a mask for ion implantation so that it was handled in the same way as usual resists.

As described above, according to semiconductor device fabrication methods of Examples 1 to 3, the surface of a substrate having been subjected to surface treatment to impart hydrogen atoms to its surface is selectively irradiated with energy rays to form an irradiated region, irradiated with the energy ray, and a non-irradiated region on the surface of the substrate, and a metal thin film is selectively formed on the non-irradiated region, where a metal film having a width of 0.1 μm or less can be deposited. Using the metal film as a mask, a metal, semiconductor or insulating film of various types, formed as a lower layer of the metal film, is etched by anisotropic etching, where the metal, semiconductor or insulating film can be processed in a width of 0.1 μm or less. The methods can bring about such effects.

EXAMPLE 4

FIGS. 4A to 4F illustrate a process for preparing a photomask according to the present invention.

Figure 4A:
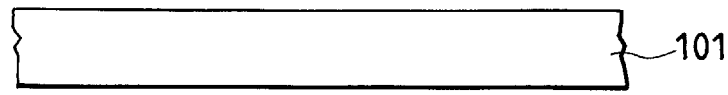
FIGS. 4A to 4F diagrammatically illustrate a pattern forming method according to a fourth example of the present invention.
Figure 4B:
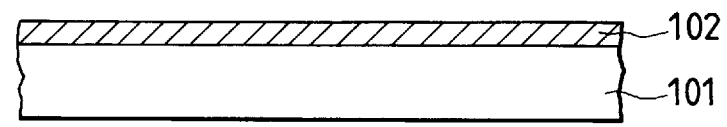

First, as shown in FIG. 4B, on the surface of a synthetic quartz glass substrate 101, a Si film 102 was deposited by sputtering in a thickness of 0.3 μm. Subsequently, to the surface of the Si film 102, a chemical treatment was applied in the following procedure.

Immersing in an H$_2$SO$_4$:H$_2$O$_2$ 4:1 solution for 10 minutes; rinsing with pure water for 10 minutes; immersing in an HF:H$_2$O 1:100 solution for 1 minute; and then rinsing with pure water for 10 minutes.

Figure 4C:
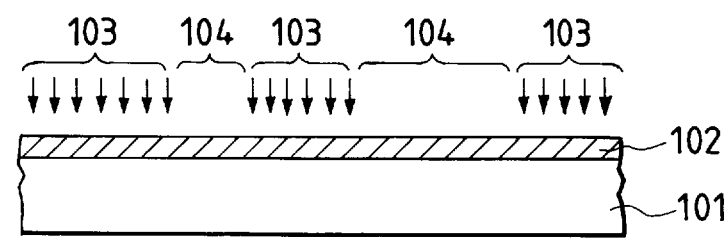

Then, as shown in FIG. 4C, the substrate with the Si film having been subjected to the chemical treatment was led into an electron beam exposure apparatus and the surface of the Si film 102 was selectively irradiated with electron beams to provide an irradiated region 103 and a non-irradiated region 104 (Step c.). The accelerating voltage of the electron beams was set at 25 kV, and the dose of the electron beams, at $5 \times 10^{17}$ electrons/cm$^2$. After the irradiation with electron rays, the substrate with the Si film was transported through the atmosphere and loaded in an Al deposition apparatus. Dimethylaluminum hydride and hydrogen mixed gas was used as reaction gas.

Figure 4D:
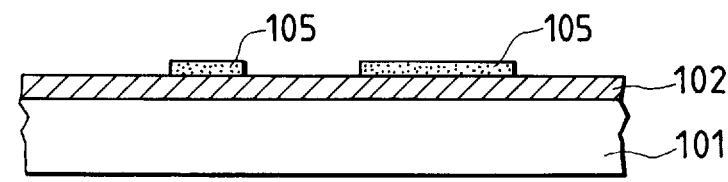
Figure 4E:
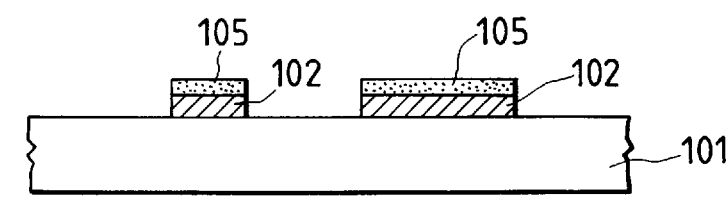

The deposition of Al was carried out under conditions of a total pressure of 1.2 Torr, a dimethylaluminum hydride partial pressure of $1.2 \times 10^{-3}$ Torr and a deposition temperature of 270° C. to form an Al film 105 in a layer thickness of 0.3 μm. At this time, no Al film was formed in the electron beam irradiated region 103 and the Al film 105 was formed only on the electron beam non-irradiated region 104 as shown in FIG. 4D (Step d.). Next, as shown in FIG. 4E, the Si film was etched by microwave plasma etching, using the Al film 105 as an etching mask. The etching was carried out using an HBr—CH$_4$—SF$_2$ mixed gas under conditions of a gas flow rate of 100 sccm (total flow rate), an etching pressure of 16 mTorr, a magnetron current of 300 mA and a substrate bias of 100 V (Step e.).

Figure 4F:
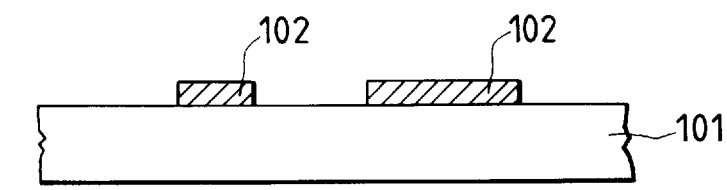

Next, as shown in FIG. 4F, the Al film used as an etching mask was removed by etching using an HCl:H$_2$O 1:1 mixed solution (Step f.).

EXAMPLE 5

FIGS. 5A to 5G illustrate a process for preparing a photomask according to the present invention.

Figure 5A:
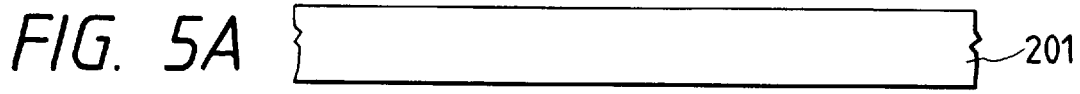
FIGS. 5A to 5G diagrammatically illustrate a pattern forming method according to a fifth example of the present invention.
Figure 5B:
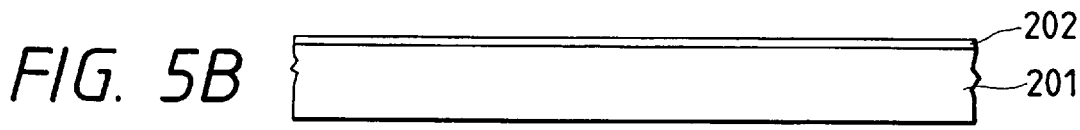

First, as shown in FIG. 5B, on the surface of a synthetic quartz glass substrate 201, a Si film 202 was deposited by sputtering in a thickness of 300 Å. Subsequently, to the surface of the Si film 202, a chemical treatment was applied in the following procedure.

Immersing in an H$_2$SO$_4$:H$_2$O$_2$ 4:1 solution for 10 minutes; rinsing with pure water for 10 minutes; immersing in an HF:H$_2$O 1:100 solution for 1 minute; and then rinsing with pure water for 10 minutes.

Figure 5C:
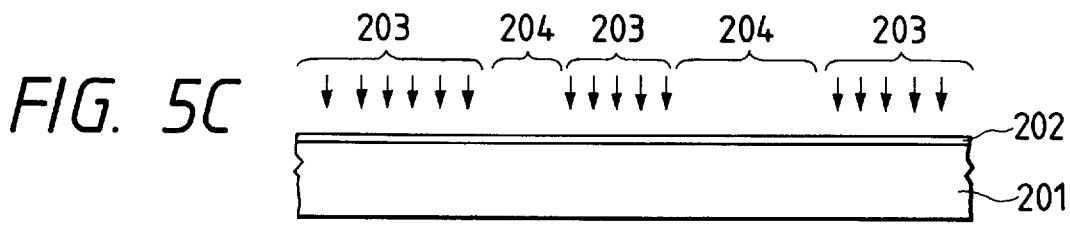
Figure 5D:
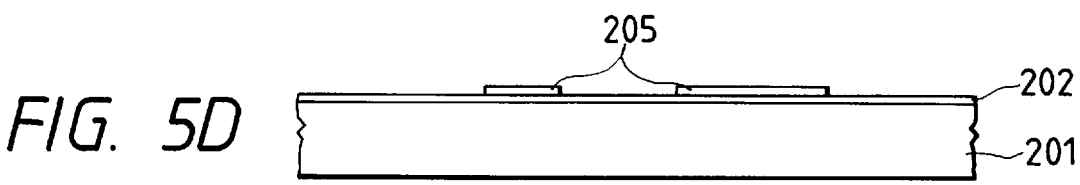
Figure 5E:
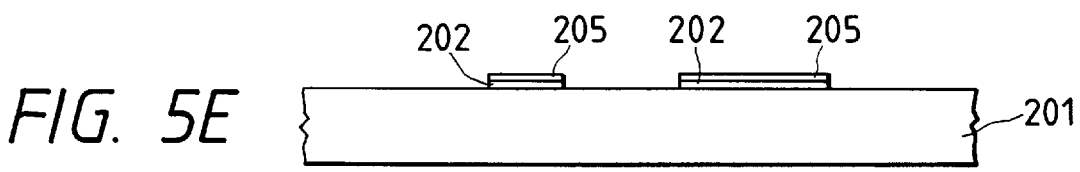

Then, as shown in FIG. 5C, the substrate with the Si film having been subjected to the chemical treatment was led into an electron beam exposure apparatus and the surface of the Si film 202 was selectively irradiated with electron beams to provide an irradiated region 203 and a non-irradiated region 204 (Step c.). The accelerating voltage of the electron beams was set at 25 kV, and the dose of the electron beams, at $5 \times 10^{17}$ electrons/cm$^2$. After the irradiation with electron rays, the substrate with the Si film was transported through the atmosphere and loaded in an Al deposition apparatus. Dimethylaluminum hydride and hydrogen mixed gas was used as reaction gas. The deposition of Al was carried out under conditions of a total pressure of 1.2 Torr, a dimethylaluminum hydride partial pressure of $1.2 \times 10^{-3}$ Torr and a deposition temperature of 270° C. to form an Al film 205 in a layer thickness of 0.3 μm. At this time, as shown in FIG. 5D, no Al film was formed in the electron beam irradiated region 203 and the Al film 205 was formed only on the electron beam non-irradiated region 204 (Step d.). Next, as shown in FIG. 5E, the Si film 202 was etched by microwave plasma-assisted etching, using the Al film 205 as an etching mask. The etching was carried out using an HBr—CH$_4$—SF$_6$ mixed gas under conditions of a gas flow rate of 100 sccm (total flow rate), an etching pressure of 16 mTorr, a magnetron current of 300 mA and a substrate bias of −100 V (Step e.).

Figure 5F:
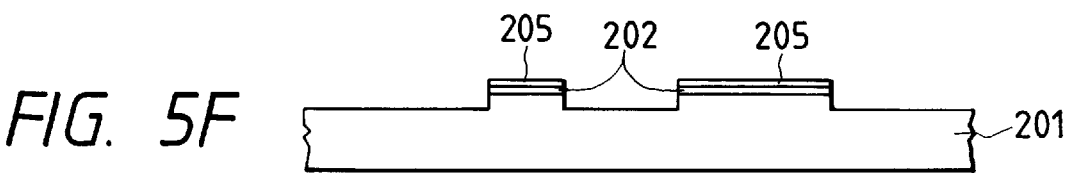

Next, as shown in FIG. 5F, the synthetic quartz substrate 201 was similarly etched by microwave plasma etching, using the Al film 205 and the Si film 202 as etching masks. The etching was carried out using a C$_2$F$_6$—CHF$_3$ mixed gas under conditions of a gas flow rate of 100 sccm (total flow rate), an etching pressure of 16 mTorr, a magnetron current of 300 mA and a substrate bias of −100 V (Step f.).

Next, the Al film used as an etching mask was removed by etching using an HCl:H$_2$O$_2$ 1:1 mixed solution.

Figure 5G:

Next, the Si film 202 remaining on the surface of the synthetic quartz substrate 201 was removed by downflow etching making use of fluorine radicals. Thus, a structure having a synthetic quartz substrate 201 whose surface had been etched in the desired shape was formed as shown in FIG. 5G (Step g.).

In such a structure, both the etched portion and the non-etched portion similarly transmit light, but there is produced a phase difference of transmitted light between the both, and hence it functions as a phase-shift mask. In the present Example, as a matter of course, a light-screening film pattern may be previously formed on the surface of the synthetic quartz substrate 201. This method can be used as a method of forming a phase shifter also in the formation of a phase-shift mask with different constitution, i.e., a phase-shift mask of a space frequency modulation type, an edge-stressed type, a light-screening effect stressed type or the like.

EXAMPLE 6

Figure 6A:
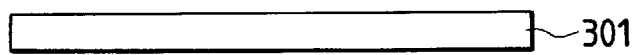
FIGS. 6A to 6I diagrammatically illustrate a pattern forming method according to a sixth example of the present invention.
Figure 6B:
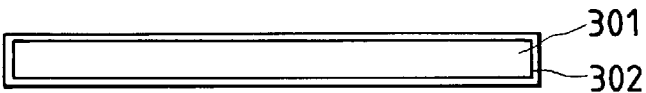
Figure 6C:
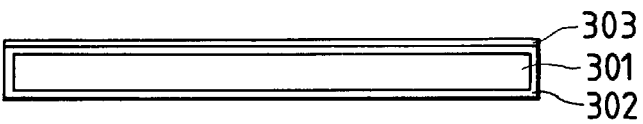
Figure 6D:
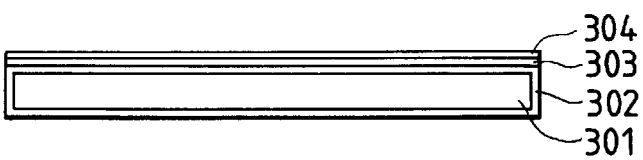

As shown in FIG. 6B, on the surfaces of a silicon wafer 301 of 3 inch diameter and 2 mm thick, a silicon nitride film 302 was deposited by chemical vapor deposition in a thickness of 3 $\mu$m thick (Step b.). Subsequently, as shown in FIG. 6C, on one side of the surfaces, a tantalum film 303 was deposited by sputtering in a thickness of 1 $\mu$m (Step c.), and as shown in FIG. 6D, further thereon a silicon film 304 was deposited by sputtering in a thickness of 0.1 $\mu$m (Step d.). Next, the surface of the silicon film 304 was cleaned in the following procedure.

Immersing in an $H_2SO_4$:$H_2O_2$ 4:1 solution for 10 minutes; rinsing with pure water for 10 minutes; immersing in an $HF$:$H_2O$ 1:100 solution for 1 minute; and then rinsing with pure water for 10 minutes.

Figure 6E:
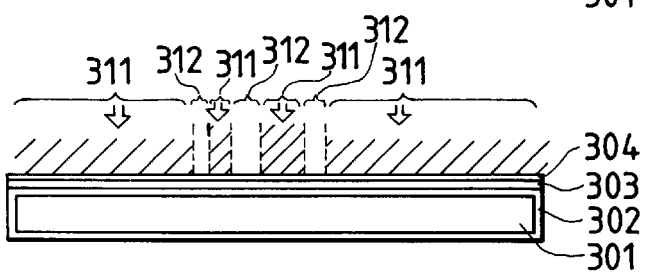
Figure 6F:
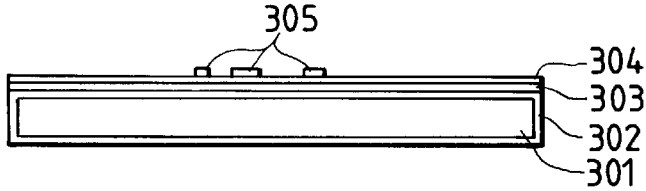
Figure 6G:
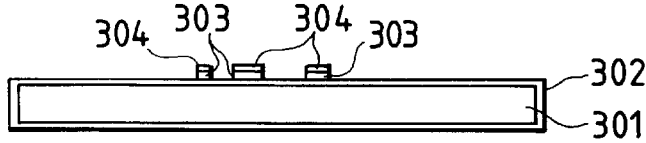
Figure 6H:
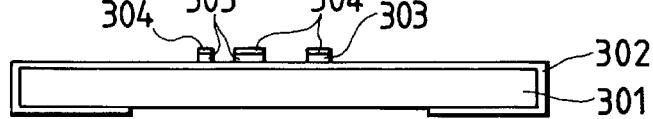
Figure 6I:
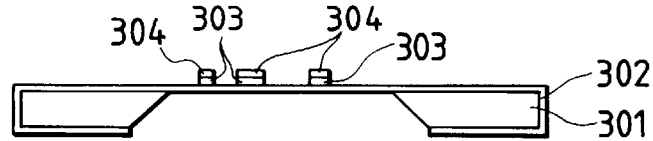

Then, the silicon wafer 301 having been cleaned was led into an electron beam exposure apparatus (not shown) and the surface of the Si film 304 was selectively irradiated with electron beams to form an electron beam irradiated region 311 and an electron beam non-irradiated region 312 as shown in FIG. 6E (Step e.). The accelerating voltage of the electron beams was set at 25 kV, and the dose of the electron beams, at $5 \times 10^{17}$ electrons/cm$^2$. After the irradiation with electron rays, the substrate was transported through the atmosphere and loaded in an Al-CVD apparatus. Dimethylaluminum hydride and hydrogen mixed gas was used as reaction gas. The deposition of an Al film was carried out under conditions of a total pressure of 1.2 Torr, a dimethylaluminum hydride partial pressure of $1.2 \times 10^{-3}$ Torr and a deposition temperature of 270° C. to form an Al film 305 in a layer thickness of 0.3 $\mu$m. At this time, no Al film was formed in the electron beam irradiated region 311 and the Al film was formed only on the electron beam non-irradiated region 312 as shown in FIG. 6F (Step f.). Next, the lower layers Si film 304 and tantalum film 303 were etched by microwave plasma etching, using the Al film 305 as an etching mask. The etching was carried out using $CF_3Br$ gas under conditions of a gas flow rate of 50 sccm, an etching pressure of 10 mTorr, a magnetron current of 300 mA and a substrate bias of −100 V. Then, as shown in FIG. 6G, the Al film 305 used as an etching mask was removed by etching using an $HCl$:$H_2O_2$ 1:1 mixed solution (Step g.). Next, as shown in FIG. 6H, the middle portion of the silicon nitride film on its back surface was etched away by photolithography (Step h.), and the surface of the uncovered silicon wafer 301 was further etched using a boiled aqueous KOH solution so that only the silicon nitride film 302 around the wafer surfaces and a silicon-tantalum multilayered film pattern formed thereon remained as shown in FIG. 6I.

Thus, it was possible to form an X-ray mask having a silicon-tantalum multilayered film as an X-ray absorbing pattern.

In conventional methods for preparing X-ray masks, secondary electron emission that occurs from the underlying Ta film when electron beams are made incident results in a lowering of resolution. In the present Example, however, the silicon film is formed on a heavy metal, and the electron beam pattern generation may be directly carried out thereon. Here, since the electron beams are used for the elimination of hydrogen atoms present on the Si surface, there can be no ill effect due to secondary electrons.

Examples 4 to 6 described above go through a two-stage process in which an electron beam pattern is first converted into an EB resist pattern and the EB resist pattern is then converted into an etching pattern by EB Lithography. The light-screening film pattern can be formed on the photomask by irradiating the surface of the light-screening film pattern with electron beams, directly forming the Al-etching mask on the electron beam non-irradiated region, and carrying out the etching using the Al-etching mask. Hence, the dimensional variation factors of the light-screening film pattern can be decreased and at the same time the process can be simplified. Moreover, the process of selectively forming the Al-etching mask on the light-screening thin film makes it possible to form a fine pattern with a width of 0.1 $\mu$m or less, and hence it becomes possible to form a photomask pattern dimensionally controllable on the order of submicrons.

EXAMPLE 7

In FIGS. 7A to 7D, reference numeral 401 denotes a quartz substrate; 402, a chromium pattern; 403, a silicon film; 404, incidence of electron rays; 405, an aluminum film; 406, an aluminum oxide film; 414, an electron ray non-irradiated region; and 424, an electron ray irradiated region.

Figure 7A:
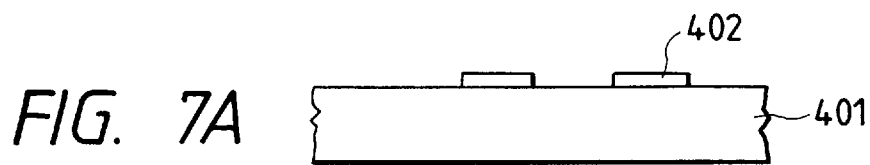
FIGS. 7A to 7D diagrammatically illustrate a pattern forming method according to a seventh example of the present invention.

First, as shown in FIG. 7A, on a quartz substrate 401 of 0.18 inch thick and 5 inches square whose surface had been polished up to the grade of a photomask, the chromium pattern 402 as a light-screening region was formed by conventional electron beam lithography (Step a.).

Figure 7B:
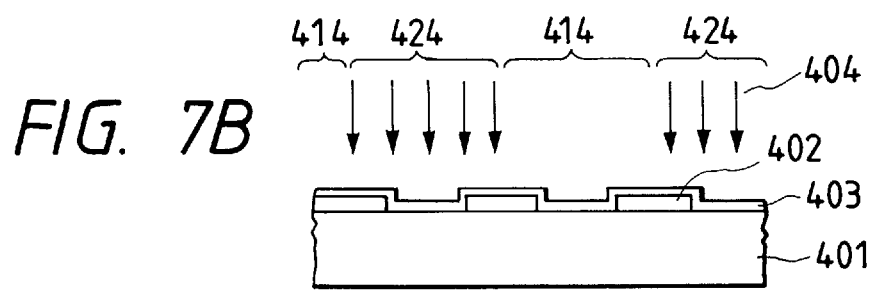

Subsequently, as shown in FIG. 7B, on the whole surface of the quartz substrate 401 with the chromium pattern 402 formed thereon, the silicon film 403 was deposited by sputtering in a thickness of 300 Å (Step b.).

Next, to the surface of the Si film 403, a chemical treatment was applied in the following procedure.

Immersing in an $H_2SO_4$:$H_2O_2$ 4:1 solution for 10 minutes; rinsing with pure water for 10 minutes; immersing in an $HF$:$H_2O$ 1:100 solution for 1 minute; and then rinsing with pure water for 10 minutes.

Then, the substrate 401 with the Si film having been subjected to the chemical treatment was led into an electron beam exposure apparatus and the surface of the Si film 403 was selectively irradiated with electron beams to provide the irradiated region 424 and the non-irradiated region 414 as shown in FIG. 7B (Step b.). The accelerating voltage of the electron beams was set at 25 kV, and the dose of the electron beams, at $5 \times 10^{17}$ electrons/cm$^2$. After the irradiation with electron rays, the substrate 401 with the Si film was transported through the atmosphere and loaded in an Al deposition apparatus. Dimethylaluminum hydride and hydrogen mixed gas was used as reaction gas. The deposition of Al was carried out under conditions of a total pressure of 1.2

Figure 7C:
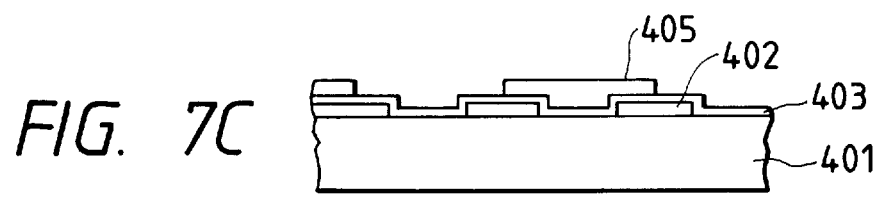

Torr, a dimethylaluminum hydride partial pressure of 1.2×$10^{-3}$ Torr and a deposition temperature of 270° C. to form the Al film 405 with a layer thickness of 0.09 µm. At this time, no Al film was formed in the electron beam irradiated region 424 and the Al film 405 was formed only on the electron beam non-irradiated region 414 as shown in FIG. 7C (Step c.).

Figure 7D:
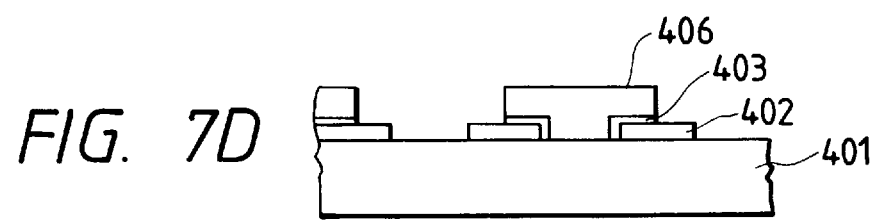

Subsequently, the substrate 401 with the Al film pattern 405 formed thereon was treated in an atmosphere of oxygen at 400° C. for 1 hour to oxidize the Al film 405. The aluminum oxide film 406 was thus formed. At this time, the aluminum oxide film 406 was in a layer thickness of 0.26 µm. In this way, it was possible to form on the quartz substrate 401 a light-screening film pattern composed of the chromium film 402 and a phase shifter pattern composed of the aluminum oxide film 406 (Step c.). In the example shown above, a silicon film 403 with a layer thickness of 300 Å remained on the surfaces of the quartz substrate 401 and the chromium film 402. This silicon film 403 was removed by downflow type plasma etching that made use of fluorine radicals as an etchant. It was possible to remove it without giving no damage on the underlying surface after the etching was completed as shown in FIG. 7D (Step d.).

Of course, in the layer structure of any of the Step c. and Step d. described above, it was possible to use the films as a phase-shift mask when the multilayer films present in the light-transmitting region were each made to have an optimum thickness.

EXAMPLE 8

In FIGS. 8A to 8E, reference numeral 501 denotes a quartz substrate; 502, a molybdenum silicide pattern; 503, a silicon film; 504, incidence of electron rays; 505, an aluminum film; 506, an aluminum oxide film; 507, a silicon oxide film; 514, an electron ray non-irradiated region; and 524, an electron ray irradiated region.

Figure 8A:
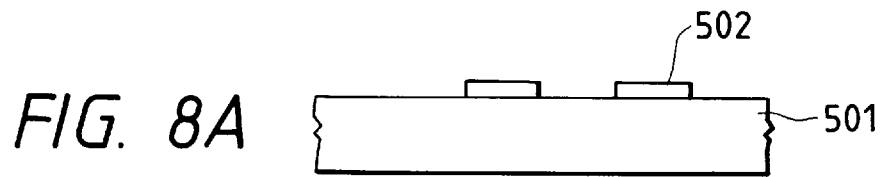
FIGS. 8A to 8E diagrammatically illustrate a pattern forming method according to an eighth example of the present invention.

First, as shown in FIG. 8A, on a quartz substrate 501 of 0.18 inch thick and 5 inches square whose surface had been polished up to the grade of a photomask, the molybdenum silicide pattern 502 as a light-screening region was formed by conventional electron beam lithography (Step a.).

Figure 8B:
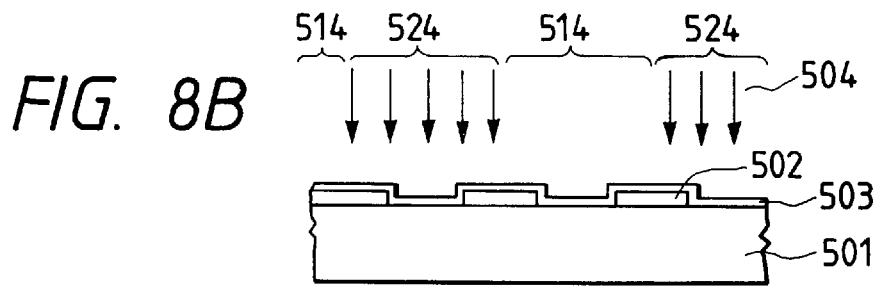

Subsequently, on the whole surface of the quartz substrate 501 with the molybdenum silicide pattern 502 formed thereon, the silicon film 503 was deposited by sputtering in a thickness of 300 Å as shown in FIG. 8B (Step b.).

Next, to the surface of the Si film 503, a chemical treatment was applied in the following procedure.

Immersing in an $H_2SO_4$:$H_2O_2$ 4:1 solution for 10 minutes; rinsing with pure water for 10 minutes; immersing in an HF:$H_2O$ 1:100 solution for 1 minute; and then rinsing with pure water for 10 minutes.

Then, the substrate with the Si film having been subjected to the chemical treatment was led into an electron beam exposure apparatus and the surface of the Si film 503 was selectively irradiated with electron beams to provide the irradiated region 524 and the non-irradiated region 514 as shown in FIG. 8B (Step b.). The accelerating voltage of the electron beams was set at 25 kV, and the dose of the electron beams, at 5×$10^{17}$ electrons/cm². After the irradiation with electron rays, the substrate 501 with the Si film was transported through the atmosphere and loaded in an Al deposition apparatus. Dimethylaluminum hydride and hydrogen mixed gas was used as reaction gas. The deposition of Al was carried out under conditions of a total pressure of 1.2 Torr, a dimethylaluminum hydride partial pressure of 1.2×$10^{-3}$ Torr and a deposition temperature of 270° C. to form the Al film 505 with a layer thickness of 0.09 µm. At this time, no Al film was formed in the electron beam irradiated region 524 and the Al film 505 was formed only on the electron beam non-irradiated region 514 as shown in FIG. 8C (Step c.).

Subsequently, the substrate 501 with the Al film pattern 505 formed thereon was treated in an atmosphere of oxygen at 400° C. for 1 hour to oxidize the Al film 505. The aluminum oxide film 506 was thus formed. At this time, the aluminum oxide film 506 was in a layer thickness of 0.26 µm. In this way, it was possible to form on the quartz substrate 501 a light-screening film pattern composed of the molybdenum silicide film 502 and a phase shifter pattern composed of the aluminum oxide film 506 (Step c.).

Figure 8C:
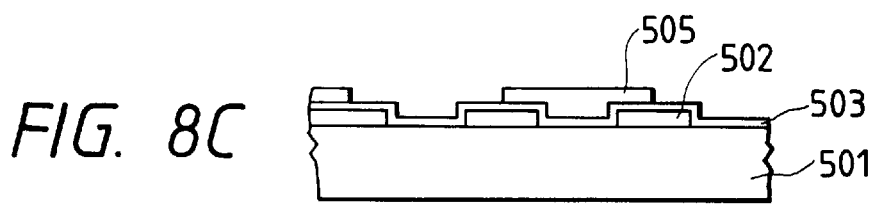
Figure 8D:
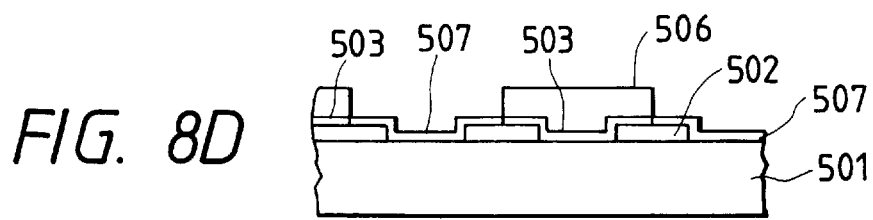

In the state as shown in Step c. i.g., FIG. 8C, the treatment was further made in an atmosphere of water vapor at 800° C. for 1 hour, so that it was possible to convert the silicon film 503 except the region covered with the aluminum oxide film 506, into the silicon oxide film 507 as shown in FIG. 8D (Step d.).

Figure 8E:
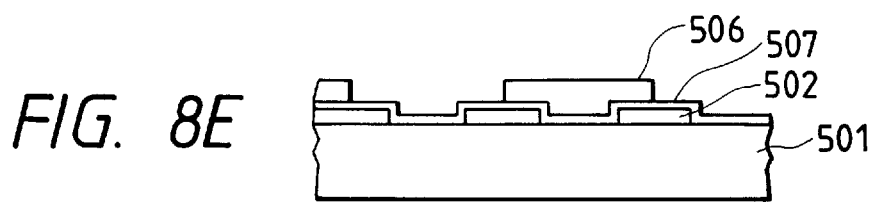

In the state as shown in Step d, i.e., in FIG. 8D, the treatment was further made in an atmosphere of water vapor at 800° C. for 10 hours, so that it was possible to convert the silicon film 503 in its entirety into the silicon oxide film 507 as shown in FIG. 8E (Step e.).

Of course, the layer structure of any of the Step c to Step e described above could used as a phase-shift mask when the multilayer films present in the light-transmitting region were each made to have an optimum thickness.

As described above, the phase shifter pattern in the phase-shift mask can be formed by making transparent thin film selectively deposited only on the region on which the phase shifter pattern is formed. Moreover, since no etching step is required in the step of forming the phase shifter pattern, no underlying substrate can be damaged, and no difference in pattern conversion can be produced in the etching step. Furthermore, as a method by which the film to be made transparent is selectively formed, the film can be deposited only on the non-irradiated region, among the electron ray irradiated region and non-irradiated region, using an electron ray exposure apparatus, and hence a film pattern having a width of from 0.1 µm or less to several µm or more can be formed at a pattern-generating precision of the electron ray exposure apparatus. Thus, according to the present invention, the phase shifter pattern can be formed with high precision without any damage on the underlying substrate.

What is claimed is:

1. A pattern forming method comprising, in sequence:
   subjecting a surface of a semiconductor substrate to surface treatment for imparting hydrogen atoms,
   irradiating a desired region of said surface with an electron beam, thereby removing hydrogen atoms imparted to the desired region,
   exposing said substrate to ambient air,
   selectively forming an aluminum film on a non-irradiated region other than the desired region by a Chemical Vapor Deposition (CVD) method using alkylaluminum hydride, and etching the desired region of said semiconductor substrate using said aluminum film as a mask to make a trench,
   removing the aluminum film, and
   heating the trench, thereby burying the inside of the trench with an oxide.

2. The pattern forming method according to claim 1, wherein said surface treatment is applied using hydrofluoric acid.

3. The pattern forming method according to claim 1, wherein the oxide is silicon oxide.

* * * * *

UNITED STATES PATENT AND TRADEMARK OFFICE
CERTIFICATE OF CORRECTION

PATENT NO. : 5,861,233           Page 1 of 3

DATED       : January 19, 1999

INVENTOR(S): YASUHIRO SEKINE, ET AL.

It is certified that error appears in the above-identified patent and that said Letters Patent is hereby corrected as shown below:

ON THE COVER PAGE:

At Item [56] FOREIGN PATENT DOCUMENTS:

"3183768" should read --3-183768--.

At Item [56] OTHER PUBLICATIONS:

"Technology A (Vaccum," should read --Technology A (Vacuum,--.

COLUMN 1:

Line 21, "of" should be deleted--; and
    Line 60, "prevalent, this" should read --prevalent. This--.

UNITED STATES PATENT AND TRADEMARK OFFICE
CERTIFICATE OF CORRECTION

PATENT NO. : 5,861,233

DATED : January 19, 1999

INVENTOR(S) : YASUHIRO SEKINE, ET AL.

It is certified that error appears in the above-identified patent and that said Letters Patent is hereby corrected as shown below:

COLUMN 2:

Line 46, "result" should read --resolution--.

COLUMN 3:

Line 48, "novel, a" should read --novel--.

COLUMN 5:

Line 3, "be consisting" should read --consist--.

COLUMN 6:

Line 53, "3 layer" should read --layer 3--.

COLUMN 7:

Line 35, "questioned" should read --in question--.

COLUMN 9:

Line 5, "HBr-SF$_2$" should read --"HBr-SF$_6$"--; and
Line 13, "gate" should read --gate electrode 25--.

COLUMN 10:

Line 12, "HBr-CH$_4$-SF$_2$" should read --HBr-CH$_4$-SF$_6$--.

UNITED STATES PATENT AND TRADEMARK OFFICE
CERTIFICATE OF CORRECTION

PATENT NO. : 5,861,233

DATED : January 19, 1999

INVENTOR(S) : YASUHIRO SEKINE, ET AL.

It is certified that error appears in the above-identified patent and that said Letters Patent is hereby corrected as shown below:

COLUMN 11:

Line 10, "both," should read --two--.

COLUMN 13:

Line 21, "giving no" should read --causing--.

COLUMN 14:

Line 12, "i.g.," should read --e.g., in--; and
    Line 23, "used" should read --be used--.

Signed and Sealed this

Fifth Day of October, 1999

Attest:

Q. TODD DICKINSON

*Attesting Officer*     *Acting Commissioner of Patents and Trademarks*